United States Patent [19]

Ringwall

[11] 3,851,670

[45] Dec. 3, 1974

[54] FLUIDIC FREQUENCY FILTER

[75] Inventor: Carl G. Ringwall, Scotia, N.Y.

[73] Assignee: The United States of America as represented by the Secretary of the Army, Washington, D.C.

[22] Filed: July 12, 1973

[21] Appl. No.: 378,488

[52] U.S. Cl. .......................... 137/814, 235/200 PF

[51] Int. Cl. .......................................... F15c 1/14

[58] Field of Search ........... 137/814, 815, 819, 820, 137/821, 826, 599, 487.5; 235/200 PF, 201 PF

[56] References Cited

UNITED STATES PATENTS

| | | | |
|---|---|---|---|
| 3,451,410 | 6/1969 | Boothe | 137/819 |
| 3,468,328 | 9/1969 | Metzger | 137/815 |
| 3,488,948 | 1/1970 | Cornett et al. | 137/819 |
| 3,699,989 | 10/1972 | O'Connor et al. | 137/487.5 |

*Primary Examiner*—William R. Cline
*Attorney, Agent, or Firm*—Edward J. Kelly; Herbert Berl; Aubrey J. Dunn

[57] ABSTRACT

A fluidic system having three parallel paths sensitive to the input frequency applied in parallel to the paths. The first path consists of one or more fluidic amplifiers providing an overall gain *g* and some degree of isolation between frequency sensitive networks. The second path is a proportional gain path and may range from a resistance attenuation network to one or more fluidic amplifiers depending on the desired damping factor. The third path consists of one or more fluidic amplifiers and has a gain *kg*. Both the first and third paths have overall transfer functions which can be expressed in terms of simple cascaded lag time constants.

8 Claims, 2 Drawing Figures

FLUID FREQUENCY FILTER

SUMMARY OF THE INVENTION

The invention is a fluid frequency filter having three parallel fluidic paths. The paths have a common input and a common output. The first path has one or more fluidic amplifiers providing an overall gain $g$ and some degree of isolation between frequency sensitive networks. The second path is a proportional gain path and may range from a resistance attenuation network to one or more fluidic amplifiers depending on the desired damping factor. The third path consists of one or more fluidic amplifiers. This path has a gain $kg$ wherein $k$ represents the ratio of gain in this path to the gain in the first path.

DETAILED DESCRIPTION OF THE INVENTION

Figure 1:
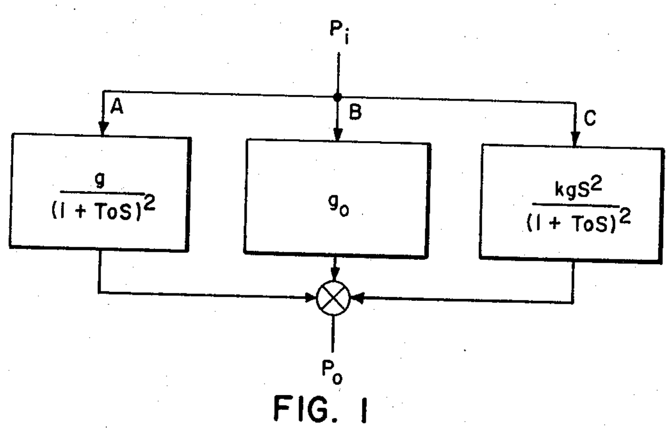
FIG. 1 is a functional block diagram of the invention.

The invention may be best understood by reference to the drawings. FIG. 1, for example, shows paths A, B, and C having the transfer functions as shown. Path A consists of one or more fluidic amplifiers providing an overall gain $g$ and preferrably some degree of isolation between two frequency sensitive networks so that the overall transfer function can be expressed in terms of simple cascaded lag time constants. Path B is a proportional gain path. This path may range from a resistance attenuation network to one or more fluidic amplifiers depending on the desired damping factor. Path C consists of one or more fluidic amplifiers. This path has a gain $kg$ wherein $k$ represents the ratio of gain in path C to the gain in path A. The amplifiers and input networks in this path form cascaded derivative networks followed by a lag time constant equal to the lag time constant in path A. The overall transfer function between input $P_i$ and output $P_o$ is $$\frac{P_o}{P_i}=\frac{(g+g_o)\left[1+2\frac{T_o g_o S}{(g+g_o)}+\frac{(gk+g_o T_o^2)S^2}{g+g_o}\right]}{1+2T_oS+T_o^2S} \quad [1]$$

The general characteristics can be highlighted by assuming $g_o$ = zero and assuming symmetrical gain characteristics on either side of the notch, i.e., $g = gkT_o^2$.

$$P_o/P_i = g\ [1+ T_o^2\ S^2]/(1 + 2\ T_o\ S + T_o^2\ S^2) \quad (2)$$

The quadratic in the denominator is heavily damped and contributes to the total gain and phase shift but has negligible effects on the rate of change of gain and phase shift at the resonant frequency $$\omega = 1/T_o.$$

The numerator has zero damping, hence the gain goes to zero at resonance. This characteristic can be obtained with practical circuits in that zero gain requires that two counter rotating vectors be generated and that they be equal in magnitude and 180° out-of-phase at the desired reference frequency.

From Equation (1) it is obvious that to obtain a low damping factor $$g_o/g + g_o << 1$$

and the transfer function can be approximated by $$\frac{P_o}{P_i}=\frac{g\left[1+\frac{2T_o g_o}{g}S+k^2s^2\right]}{1+\frac{2S}{\omega_o}+\frac{S^2}{\omega_o^2}} \quad [3]$$

Transfer function (3) shows that the resonant frequency can be varied by changing $k$ or the relative gains between paths A and C. The damping factor can be made directly proportional to $g_o$ or the gain in the proportional path.

Figure 2:
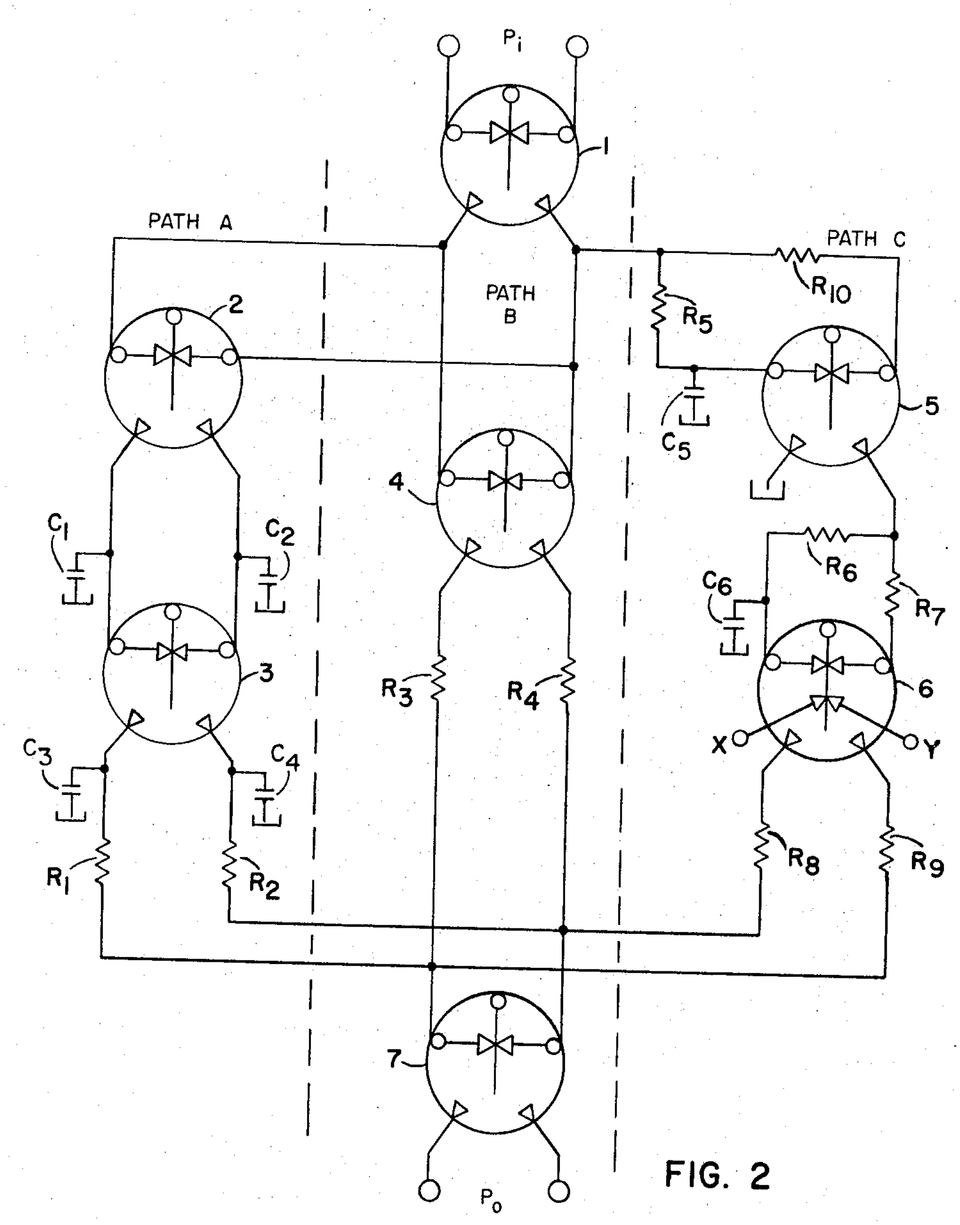
FIG. 2 is a schematic diagram of the invention.

FIG. 2 shows a more detailed diagram of the block diagram shown in FIG. 1. Amplifier 1 is a buffer amplifier which takes a push-pull input signal applied at $P_i$, amplifies it, and supplys the outputs for the three parallel paths. Path A is made up of two cascaded amplifiers 2 and 3. These amplifiers provide an overall gain $g$ and in addition 2 provides isolation between the two lag networks composed of fluidic capacities $C_1$, $C_2$, $C_3$, and $C_4$, and output impedances $R_1$ and $R_3$.

Path B consists of a single proportional amplifier 4 and its output impedances $R_3$ and $R_4$. In applications requiring very low damping factors, this amplifier is not required. Path C is made up of amplifiers 5 and 6. Each amplifier together with the fluidic capacitors $C_5$ and $C_6$ and resistors $R_5$ through $R_{10}$ forms a derivative network followed by a time lag constant. Amplifier 6 is shown as a variable gain amplifier. The gain is a function of the signal pressure applied to control ports X and Y. The resonant frequency can thus be varied by applying a pressure signal across ports X and Y. A variable damping factor can be provided by using a variable gain amplifier substituted for amplifier 4. The outputs of the three paths are summed in amplifier 7.

It should be understood that a pressure source (not shown) provides fluid to the power jets of amplifiers 1–7. As can be seen on FIG. 2, one output of amplifier 5 is returned to the sump of the pressure source.

Typical values of the various resistors and capacitors of my invention are as follows:

| Element | Value | Units |
|---|---|---|
| $R_1$ | $10^5$ | sec/in² |
| $R_2$ | $10^5$ | sec/in² |
| $R_3$ | $2 \times 10^5$ | sec/in² |
| $R_4$ | $2 \times 10^5$ | sec/in² |
| $R_5$ | $5 \times 10^4$ | sec/in² |
| $R_6$ | $5 \times 10^4$ | sec/in² |
| $R_7$ | $5 \times 10^4$ | sec/in² |
| $R_8$ | $10^5$ | sec/in² |
| $R_9$ | $10^5$ | sec/in² |
| $R_{10}$ | $5 \times 10^4$ | sec/in² |
| $C_1$ | $2 \times 10^{-7}$ | in² |
| $C_2$ | $2 \times 10^{-7}$ | in² |
| $C_3$ | $2 \times 10^{-7}$ | in² |
| $C_4$ | $2 \times 10^{-7}$ | in² |
| $C_5$ | $5 \times 10^{-8}$ | in² |
| $C_6$ | $5 \times 10^{-8}$ | in² |

While a particular embodiment of the invention has been shown and described, other embodiments may be obvious to one skilled in the art in view of the instant disclosure.

I claim:

1. A fluidic frequency filter including first, second, and third parallel fluid paths having a common fluidic signal input; a fluidic output summer for said paths; said first fluid path including fluidic frequency sensitive means for introducing a time lag to signals on said input; said second fluid path including fluidic means for providing a proportional gain to signals on said input; and said third fluid path including fluidic frequency sensitive means for introducing a time lag and fluidic means for providing a gain $k$ to signals on said input whereby $k$ is greater than 1.

2. The fluidic filter as defined in claim 1 wherein said first fluid path includes first and second fluidic amplifiers, each having a power jet, control jets, and output ports, with said control jets of said first fluidic amplifier connected to said signal input; first fluidic means connecting said output ports of said first fluidic amplifier to said control jets of said second fluidic amplifier; and second fluidic means connecting said output ports of said second fluidic amplifier to said fluidic output summer.

3. The fluidic filter as defined in claim 2 wherein said first fluidic means connecting comprises fluidic capacitors; and said second fluidic means connecting comprises series-connected fluidic capacitors and fluidic resistors.

4. The fluidic filter as defined in claim 3 wherein said second fluid path includes at least one fluidic amplifier.

5. The fluidic filter as defined in claim 3 wherein said second fluid path includes fluidic resistive means.

6. The fluidic filter as defined in claim 5 including a fluidic system sump; wherein said third fluid path includes third and fourth fluidic amplifiers, each having a power jet, control jets and two output ports, said third fluidic amplifier having two control jets; third fluidic means connecting said control jets of said third fluidic amplifier to said fluidic signal input; fourth fluidic means connecting one of said output ports of said third amplifier to input jets of said fourth amplifier, the other output port of said third amplifier being dumped to system sump; and fifth fluidic means connecting said output ports of said fourth amplifier to said fluidic output summer.

7. The fluidic filter as defined in claim 6 wherein said third fluidic means connecting includes a series connected fluidic resistor and a fluidic capacitor connected between said common fluidic signal input and one input jet of said third fluidic amplifier and further including another fluidic resistor connected between said common fluidic signal input and the other input jet of said third fluidic amplifier.

8. The fluidic filter as defined in claim 6 wherein said fourth fluidic means connecting includes a series connected fluidic resistor and fluidic capacitor connected between one output of said third fluidic amplifier and one input of said fourth fluidic amplifier and further including another fluidic resistor connected between said one output of said third fluidic amplifier and the other input of said fourth fluidic amplifier.

* * * * *